United States Patent
Zhang et al.

(10) Patent No.: US 9,048,387 B2
(45) Date of Patent: Jun. 2, 2015

(54) LIGHT-EMITTING DEVICE WITH IMPROVED LIGHT EXTRACTION EFFICIENCY

(71) Applicant: QINGDAO JASON ELECTRIC CO., LTD., Qingdao (CN)

(72) Inventors: Jianping Zhang, Qingdao (CN); Ying Gao, Qingdao (CN); Shuai Wu, Qingdao (CN); Ling Zhou, Qingdao (CN)

(73) Assignee: QINGDAO JASON ELECTRIC CO., LTD., Shangdong (CN)

( * ) Notice: Subject to any disclaimer, the term of this patent is extended or adjusted under 35 U.S.C. 154(b) by 82 days.

(21) Appl. No.: 13/964,030

(22) Filed: Aug. 9, 2013

(65) Prior Publication Data

US 2015/0041755 A1  Feb. 12, 2015

(51) Int. Cl.
- H01L 33/00 (2010.01)
- H01L 33/32 (2010.01)
- H01L 33/06 (2010.01)
- H01L 33/12 (2010.01)

(52) U.S. Cl.
CPC ............... H01L 33/32 (2013.01); H01L 33/06 (2013.01); H01L 33/12 (2013.01)

(58) Field of Classification Search
CPC ....... H01L 33/32; H01L 33/14; H01L 33/007; H01L 33/0075; H01L 33/025; H01L 21/02458; H01L 21/0254; H01L 33/16; H01L 33/0025; H01L 33/30; H01L 21/02389; H01L 21/0251; H01L 21/0259; H01L 33/0066; H01L 33/305; B82Y 20/00; H01S 5/3063; H01S 5/3215

USPC ............ 257/13, 14, 101, 102, 103, E33.025, 257/E33.028, E33.033, E33.034, E33.048
See application file for complete search history.

(56) References Cited

U.S. PATENT DOCUMENTS

| | | | |
|---|---|---|---|
| 5,955,749 A | 9/1999 | Joannopoulos et al. | |
| 7,166,870 B2 | 1/2007 | Erchak et al. | |
| 7,173,289 B1 | 2/2007 | Wu et al. | |
| 7,250,635 B2 | 7/2007 | Lee et al. | |
| 7,326,963 B2 * | 2/2008 | Gaska et al. | 257/79 |
| 7,355,210 B2 | 4/2008 | Ou et al. | |
| 7,422,962 B2 | 9/2008 | Chen et al. | |
| 7,615,398 B2 | 11/2009 | McKenzie et al. | |
| 7,642,108 B2 | 1/2010 | Krames et al. | |
| 7,652,295 B2 | 1/2010 | Cho et al. | |
| 7,652,299 B2 | 1/2010 | Urashima et al. | |
| 8,154,034 B1 * | 4/2012 | Zhang et al. | 257/90 |

(Continued)

OTHER PUBLICATIONS

J.P. Zhang et al., "Milliwatt power deep ultraviolet light-emitting diodes over sapphire with emission at 278 nm" Applied Physics Letters, vol. 81, No. 26, Dec. 23, 2002, pp. 4910-4912.

*Primary Examiner* — Victor A Mandala
(74) *Attorney, Agent, or Firm* — J.C. Patents

(57) ABSTRACT

A light emitting device with improved light extraction efficiency includes an n-type layer, a p-type layer, an active region sandwiched between the n-type layer and the p-type layer, a characteristic AlGaN layer over which the n-type layer is formed, and an AlN layer on which the characteristic AlGaN layer is formed. The characteristic AlGaN layer has gradually enlarging bandgap width from that of the n-type layer to that of the AlN layer in the direction pointing from the n-type layer to the AlN layer. The light-emitting device may further include a nanoporous AlN layer over which the AlN layer is formed.

20 Claims, 9 Drawing Sheets

(56) References Cited

U.S. PATENT DOCUMENTS

| | | |
|---|---|---|
| 8,227,789 B2 | 7/2012 | Hirayama et al. |
| 8,384,111 B2 | 2/2013 | Tadatomo et al. |
| 2005/0224781 A1* | 10/2005 | Kneissl et al. .................. 257/14 |
| 2009/0079035 A1* | 3/2009 | Wang ............................ 257/615 |
| 2009/0179221 A1* | 7/2009 | Han ............................... 257/103 |
| 2010/0032647 A1* | 2/2010 | Khan et al. ....................... 257/13 |
| 2013/0187124 A1* | 7/2013 | Zhang et al. ..................... 257/13 |

* cited by examiner

US 9,048,387 B2

LIGHT-EMITTING DEVICE WITH IMPROVED LIGHT EXTRACTION EFFICIENCY

FIELD OF THE INVENTION

The present invention relates in general to light-emitting device having improved light extraction efficiency, more particularly to III-nitride light-emitting device having improved light extraction efficiency.

DESCRIPTION OF THE RELATED ART

Nitride based light-emitting diodes (LEDs) have achieved fast progress in recent years. In the visible spectrum regime, InGaN LEDs are increasingly challenging traditional lighting sources such as incandescent lamps or fluorescent lamps, due to their technological and economical advantages. Currently, high-efficiency InGaN LED white light lamps with efficacy over 130 lm/watt are commercially available. In the ultraviolet regime, especially in the UVB/UVC regime, AlGaN LEDs, even though still in the technological debut stage, have already outperformed the traditional UV light sources in the lifetime, UV-power-density aspects. High-efficiency UVB/UVC LEDs will lead to numerous disinfection applications using the UV germicidal effect, making revolutionary advances in food safety, water treatment, and medical applications.

Unlike traditional light sources, LED light sources generate light in a solid-state material, which usually possesses a refractive index, n, above 2, much larger than that of air or free space (n equal to 1). For example, for GaN-based visible LEDs, the light-emitting medium, InGaN, has a refractive index above 2.46 depending on the indium composition. When a ray of light is incident from an optically denser medium to a less dense medium, a total internal reflection (TIR) takes place at the interface if the angle of incidence is over a critical angle. Referring to FIG. 1A, suppose the optically denser medium has a refractive index $n_2$, and the less dense one has a refractive index $n_1$, the critical angle, $\theta_c$, is define by the equation: $\theta_c = \arcsin n_1/n_2$. Because of the total internal reflection, light can only escape from the optically denser medium to the less dense medium within a light escape cone (a cone with a solid angle: $\Omega = 2\pi(1-\cos\theta_c)$). The light escape percentage through the cone equals to $(1-\cos\theta_c)/2$ if light transmitted omnidirectional. In the following content, in order to be more specific, only light transmitted downwards (FIG. 1A) is considered and used to explain the concept of the present invention. In this sense, the light escape percentage over the downwards transmitted light is $(1-\cos\theta_c)$, which is plotted as a function of the refractive index ratio, $n_2/n_1$ (FIG. 1B). As seen, the light escape percentage decreases quickly with the ratio $n_2/n_1$. For example, when $n_2/n_1$ equals to 1.1, approximately 58% light can be transmitted from the optically denser medium to the less dense medium. This means that a 10% refractive index difference can result in a light extraction efficiency loss of 42%.

In view of this poor light extraction efficiency limited by total internal reflection, methods like surface/interface roughening (e.g. U.S. Pat. Nos. 7,422,962, 7,355,210 (surface roughing), U.S. Pat. Nos. 8,384,111, 8,154,034 (substrate patterning), aiming at reducing total internal reflection), LED chip side-wall shaping (e.g. U.S. Pat. No. 7,652,299, aiming at increase light escape cones), and photonic crystal incorporation (e.g. U.S. Pat. Nos. 5,955,749, 7,166,870, 7,615,398, 7,173,289, 7,642,108, 7,652,295, 7,250,635, aiming at enhancing spontaneous light generation rate and light extraction for specific wavelengths) were introduced in the prior art. The contents of the above US patents are incorporated herein by reference in their entirety.

SUMMARY OF THE INVENTION

The present invention discloses a light emitting device with improved light extraction efficiency and method of manufacturing the same. Throughout the specification, the term III-nitride or nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$. A III-nitride layer or active-region means that the layer or active-region is made of III-nitride semiconductors.

One aspect of the present invention provides a nanoporous layer with nanopores which can be incorporated into a conventional light-emitting or LED structure. In the field of III-nitride light-emitting structure or device, the nanoporous layer can be a nanoporous nitride layer. The nanoporous nitride layer in general can be made of doped or undoped $Al_xIn_yGa_{1-x-y}N$ with $0.1 \geq x \geq 0$ and $0.1 \geq y \geq 0$, or $1 \geq x \geq 0.5$ and $0.1 \geq y \geq 0$, for example, $Al_xGa_{1-x}N$ or $In_yGa_{1-y}N$, with GaN or AlN being a specific example. The nanoporous nitride layer can have a thickness of 100-2000 nm, for example 200-1000 nm. The nanoporous nitride layer comprises randomly distributed nanopores. The nanopores may have a vertical dimension (depth in the direction of growth of the nanoporous nitride layer) equal or close to, or smaller than the thickness of the nanoporous nitride layer. For example, the nanopores may have a depth of 20-600 nm. The nanopores may have lateral dimension of 20-100 nm and a density of $5 \times 10^8$ cm$^{-2}$-$1 \times 10^{10}$ cm$^{-2}$. In another way of description, the nanoporous layer may have nanopores of density of $5 \times 10^8$ cm$^{-2}$-$1 \times 10^{10}$ cm$^{-2}$ with porosity of 5%-50%.

Another aspect of the present invention provides a method of forming the nanoporous nitride layer. The method involves epitaxial growth of the nanoporous nitride layer at a temperature in the range of 1000° C.-1150° C. The epitaxial growth can be performed under ammonia ambient. Preferably, the epitaxial growth is periodically alternatively performed under ammonia-rich and ammonia-deficient ambient[ ]. The overall epitaxial growth rate can be in the range of 300-1000 nm per hour. Depending on the epitaxial growth rate, the alternative ammonia-rich and ammonia-deficient ambient can last for 6 to 20 seconds and 24 to 10 seconds[ ], respectively. The nanoporous nitride layer can be formed on another nitride layer or a nitride template layer, or directly on a substrate selected from the group consisting of sapphire, silicon carbide (SiC), aluminum nitride (AlN) and silicon (Si). The method may further involve ex-situ nanopore modification process, which can be done via wet chemical etch of the in-situ formed nanoporous nitride layer to enlarge the nanopore size and modify its shape, in order to obtain the desired porosity.

Another aspect of the present invention provides a III-nitride light-emitting device and device structure, characterized by forming a nitride nanoporous layer directly on the substrate of the light-emitting device. In one embodiment, the III-nitride light-emitting device is a UV LED emitting in the UVB to UVC regime (e.g., 340 nm to 240 nm), whereas the substrate is sapphire substrate and the nanoporous nitride layer is a nanoporous AlN layer. In another embodiment, the III-nitride light-emitting device is a visible LED emitting in the near UV to red regime (e.g., 380 nm to 650 nm), whereas the substrate is sapphire substrate and the nanoporous nitride layer is a nanoporous GaN layer.

Another aspect of the present invention provides a UV light-emitting device or structure. The UV light-emitting device emits UV light with wavelengths from 240 nm to 340 nm. The UV light-emitting device comprises AlGaN multiple quantum well (MQW) based active-region, which is formed over a nitride layer stack at least comprising a slightly doped $n^-$-AlGaN layer, a heavily doped $n^+$-AlGaN layer, an undoped AlGaN layer, a characteristic AlGaN layer and an AlN layer in sequence. The nitride layer stack can be formed on a substrate such as a sapphire, GaN, AlN, Si substrate. The characteristic AlGaN layer is of thickness larger than or at least comparable to the AlGaN MQW emission wavelength as measured in the undoped AlGaN layer optical medium. Furthermore, the characteristic AlGaN layer contains gradually increasing Al-content, from the Al-content of the undoped AlGaN layer to 100%. In one embodiment, the UV light-emitting device may further contain a nanoporous AlN layer in-between the AlN layer and the substrate.

Still another aspect of the present invention provides a visible light-emitting device or structure. The visible light-emitting device emits visible light with wavelengths from 380 nm to 650 nm. The visible light-emitting device comprises InGaN MQW based active-region, which is formed over a nitride layer stack at least comprising a slightly doped $n^-$-GaN layer, a heavily doped $n^+$-GaN layer, an undoped GaN layer, a characteristic AlGaN layer and an AlN layer in sequence. The nitride layer stack can be formed on a substrate such as a sapphire, GaN, AlN, Si substrate. The characteristic AlGaN layer is of thickness larger than or at least comparable to the InGaN MQW emission wavelength as measured in the undoped GaN layer optical medium. Furthermore, the characteristic AlGaN layer contains gradually increasing Al-content, from the 0% to 100%. In one embodiment, the visible light-emitting device may further contain a nanoporous AlN layer in-between the AlN layer and the substrate.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 3i illustrates the bandgap width or Al-content of part of the embodiment LED structure shown in FIG. 3.

DETAILED DESCRIPTION OF EMBODIMENTS

In the following contents, nitride light-emitting devices or structures are used as embodiments to elucidate the principle and spirit of the present invention. Those of ordinary skills in the field can apply the teachings in this specification and given by the following embodiments of nitride light-emitting devices or structures to II-VI semiconductor and other semiconductor devices or light-emitting devices without creative work.

Figure 1A:
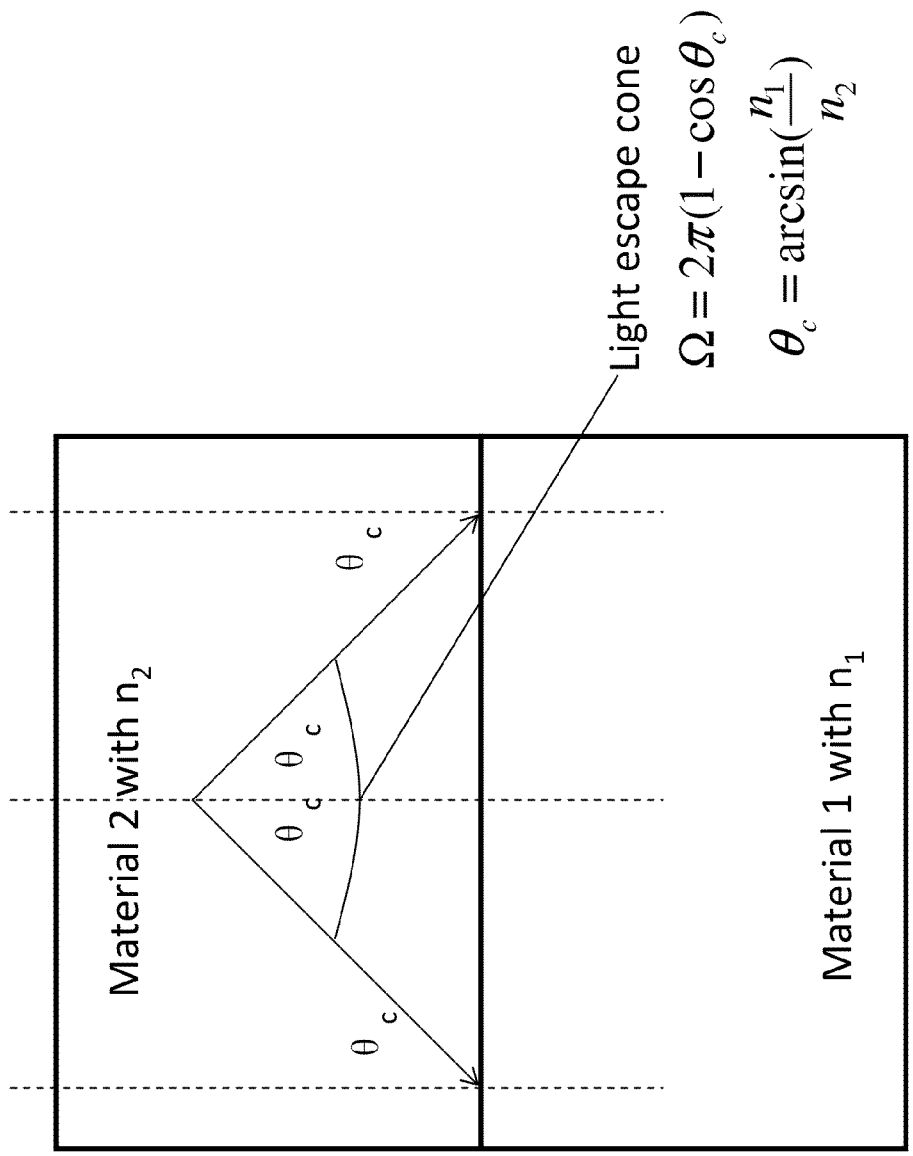
FIG. 1A illustrates the concept of total internal reflection and light escape cone.
Figure 1B:
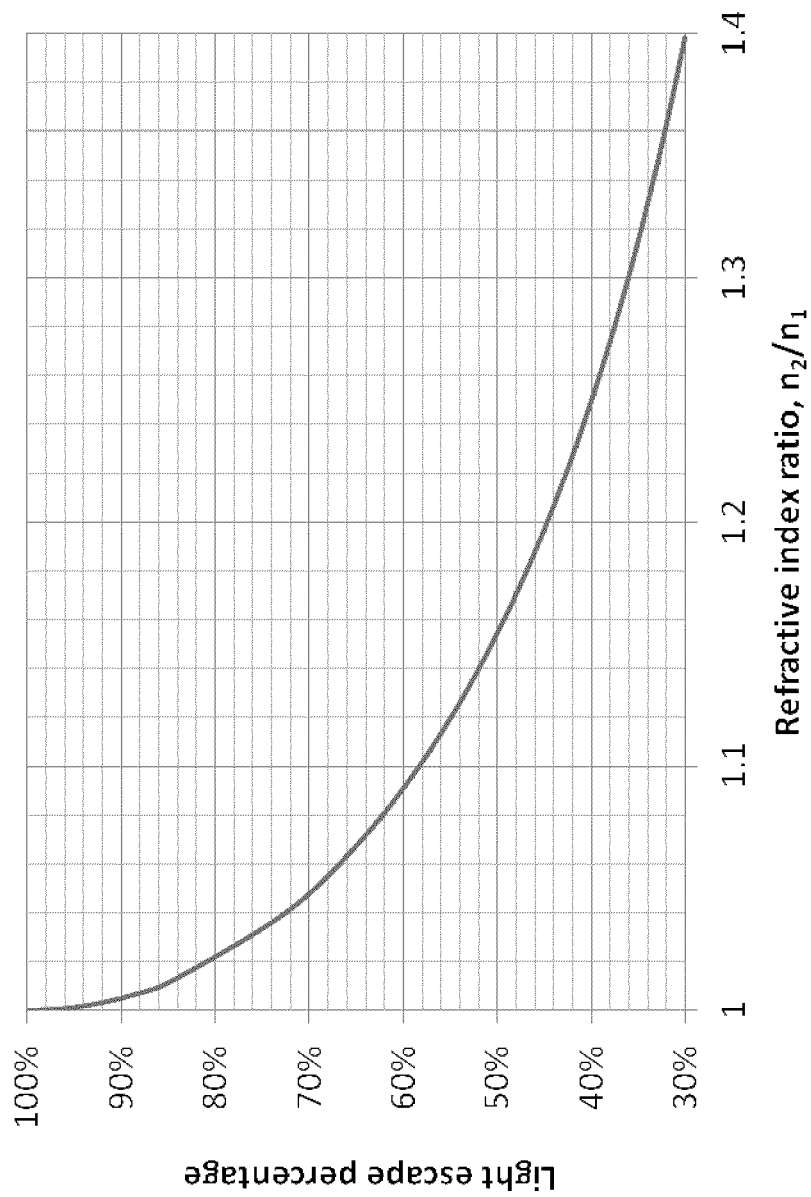
FIG. 1B plots the light escape percentage for light transmitted from optical dense medium ($n_2$) to optical light medium ($n_1$), as a function of the refractive index ratio, $n_2/n_1$.

In order to have high internal quantum efficiency, an LED usually contains numerous epitaxial layers with different compositions designed to reduce material defects and improve carrier confinement. However, according to the analysis given in FIG. 1A and FIG. 1B, a small refractive index difference owing to the composition difference can give rise to significant light extraction efficiency loss. As such, additional design rule has to be installed regarding to high light extraction efficiency LEDs.

In the prior art, in order to have efficient AlGaN-based UV LEDs, c-plane sapphire has been chosen as transparent substrate. Formed over sapphire the first layer is an AlN layer, designed for threading dislocation reduction. Following the AlN layer is either a set of AlN/AlGaN superlattice for further dislocation reduction, or an undoped AlGaN layer. The prior art AlGaN-based UV LEDs structures can be found in the literature (e.g.: "*Milliwatt Power Deep Ultraviolet Light Emitting Diodes over Sapphire with Emission at 278 nm*", J. P. Zhang, et al, Appl. Phys. Lett. 81, 4910 (2002); U.S. Pat. Nos. 8,227,789; 7,326,963; U.S. Pat. Pub. No. 2010/0032647, the contents of the above article and patents and patent applications are incorporated herein by reference in their entirety.).

Figure 2:
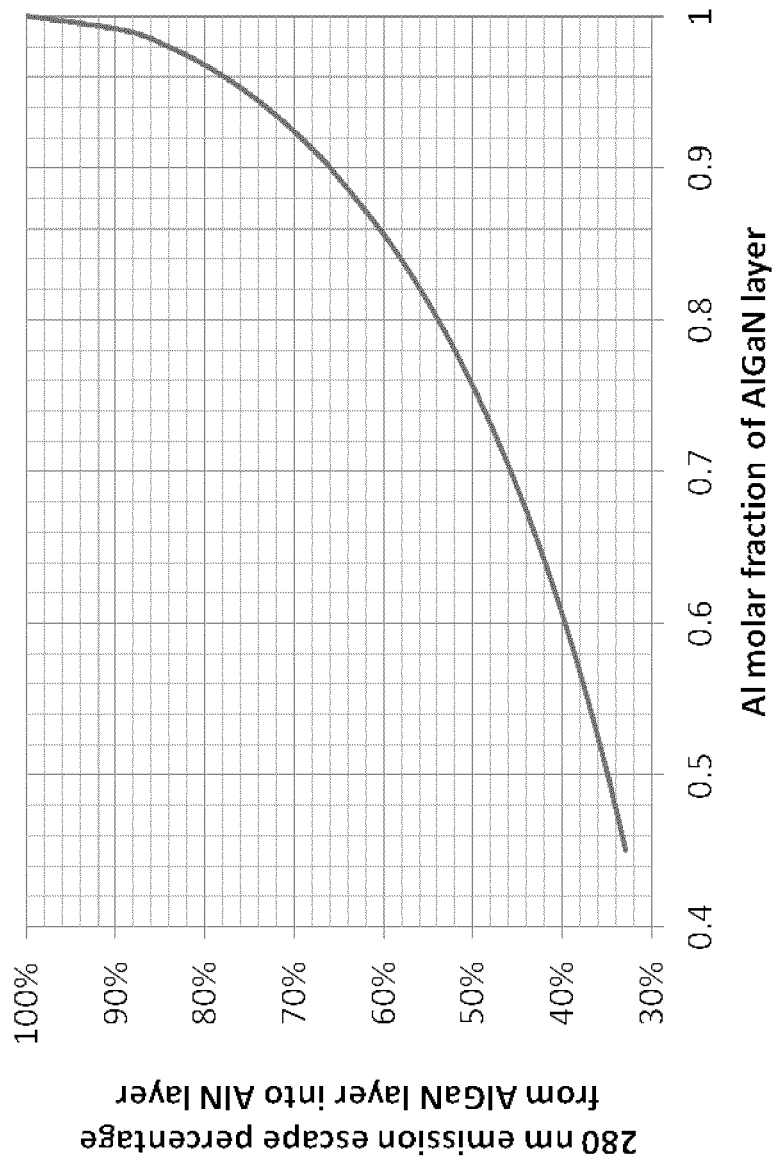
FIG. 2 plots the light escape percentage for light transmitted from AlGaN layer to AlN layer, as a function of the Al-molar-fraction of the AlGaN layer.

AlGaN-based UV LEDs usually emit UV light through substrate side or n-side, because on p-side, p-GaN is employed for p-type ohmic contact and p-GaN severely absorbs UV light. For UV light emitted by the active-region MQW to be transmitted to n-side, it has to pass through the AlN/AlGaN interface. Plotted in FIG. 2 is an example of light escape percentage (TIR constraint) for 280 nm UV light transmitted from an AlGaN layer to an AlN layer, as a function of the Al-molar-fraction of the AlGaN layer. As seen, the TIR loss is significant, for 280 nm UV light from an AlGaN layer of Al-molar-fraction of 0.9, only ~66% 280 nm can be transmitted into the AlN layer, and this number goes down to ~40% for an Al-molar-fraction of 0.6. Since on p-side p-GaN and p-contact are highly UV-absorbing, the reflected light can be considered as total loss.

Figure 3:
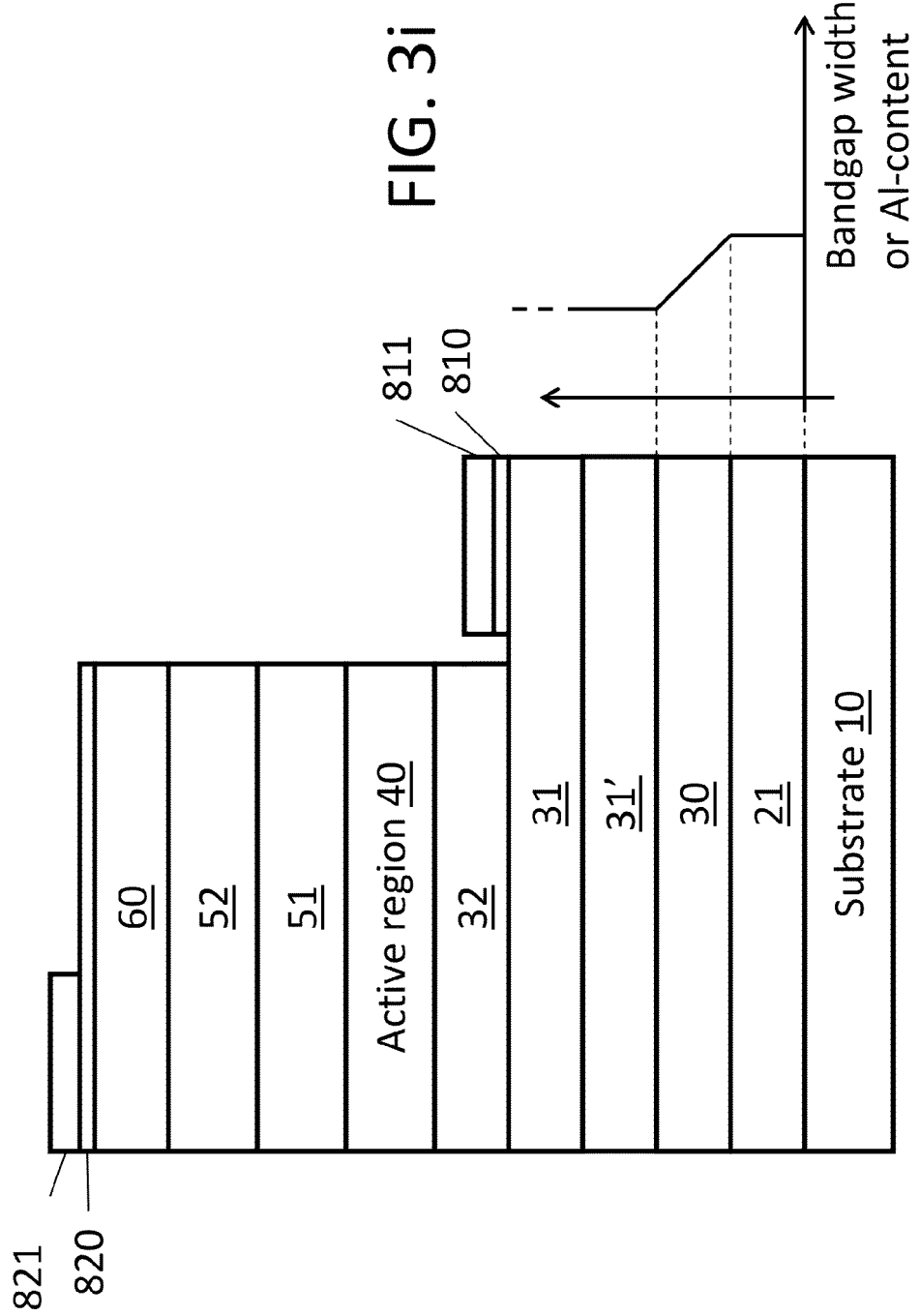
FIG. 3 illustrates the layered structure of an LED embodiment according to one aspect of the present invention.

In view of this severe light TIR loss, embodiments of the present invention provides a UV LED structure for improved UV light extraction efficiency, as is illustrated in FIG. 3. Substrate 10 can be selected from sapphire, AlN, or GaN, Si, and SiC, provided that the absorbing substrate can be removed upon device fabrication. Formed over substrate 10 is an epitaxial layer 21, such as an AlGaN layer with Al-molar-fraction equal to or higher than 90%, for example, 93% to 97%, preferably being an AlN layer. Formed over layer 21 are an undoped AlGaN layer 31', a heavily Si-doped n$^+$-AlGaN layer 31 ([Si]=3×10$^{18}$ cm$^{-3}$-1×10$^{19}$ cm$^3$), and a slightly Si-doped n$^-$-AlGaN layer 32 ([Si]=1×10$^{17}$ cm$^{-3}$-5×10$^{17}$ cm$^{-3}$). Layers 31', 31, and 32 are of substantially the same Al-molar-fraction. Active-region 40 formed over layer 32 may comprise 3-15 pairs of AlGaN/AlGaN multiple quantum wells, configured to emit the desired UV emission. A p-type AlGaN layer serving as electron blocking layer 51 is formed over active-region 40. The Al-molar-fraction of layer 51 is selected to have a conduction band discontinuity higher than 100 meV, with respect to the conduction band of the last AlGaN quantum bather of the active-region 40. P-type AlGaN layer 52 together with heavily Mg-doped p-GaN layer 60 acting as hole supplier structure for hole injection and p-type contact formation are formed over layer 51. P- and n-ohmic contact layers 820 and 810 are formed on p-type GaN layer 60 and n$^+$-AlGaN layer 31, with p-contact pad 821 and n-contact pad 811 formed thereon, respectively.

The distinguishing part of the UV LED structure shown in FIG. 3 is the incorporation of a characteristic AlGaN layer 30, which is of thickness larger than or at least comparable to the AlGaN MQW emission wavelength as measured in the optical medium of the undoped AlGaN layer 31'. This is to say, that if the MQW emission wavelength is λ nm measured in air, and the refractive index of layer 31' is n, then the thickness of layer 30 is larger than or at least comparable to λ/n nm. For example, if the MQW emitting λ=280 nm in air, and the refractive index of layer 31' n equal to 2.5, then the thickness of layer 30 is larger than, or equal to, or at least comparable to 112 nm. The term "comparable" as used above means that the thickness of layer 30 can be larger than or equal to 80%, 90%, 100% or 120% [?] of the AlGaN MQW emission wavelength as measured in the optical medium of the undoped AlGaN layer 31'. Usually, layer 30 can have a thickness in the range of 100 nm to 1000 nm. Furthermore, the characteristic layer 30 inserted in-between layer 21 and layer 31' is characterized by its gradually enlarging bandgap width, increasing from that of layer 31' to that of layer 21, in the direction pointing from layer 31' to layer 21 (FIG. 3i). At the interface between layer 31' and layer 30, the bandgap width of layer 30 can be substantially equal to or slightly larger than (for example 103% of) that of layer 31', at the interface between layer 21 and layer 30, the bandgap width of layer 30 can be equal to or slightly smaller than (for example 97% of) that of layer 21. This is achieved via gradually increasing the characteristic AlGaN layer's (layer 30) Al-content, from the Al-content of the undoped AlGaN layer (layer 31') to that of the layer 21 (FIG. 3i).

In an embodiment of the present invention, layer 21 is a 0.3-3.0 μm-thick AlN layer, and layer 31' is an 0.2-0.5 μm-thick AlGaN layer with Al-molar-fraction of 60%, the characteristic layer 30 is a 0.4-0.6 μm-thick such as 0.5 μm-thick AlGaN layer with linearly decreasing Al-molar-fraction from 100% to 60%, in the direction pointing from layer 21 to layer 31'. Other modifications to this embodiment, such as adding dopant or small amount of other elements such as In, Zr and Ti into the structure shall be considered as being within the scope of the present invention.

The Al-content change in characteristic layer 30 is preferred to be smooth and gradual; it can be linear or nonlinear. The change can also be stair-case-like as long as the stair-case distribution is rather uniform and the overall Al-content average change rate is less than 0.5% per nanometer along the thickness direction.

The incorporation of the characteristic layer 30 eliminates the total internal reflection for light transmitted from layer 31' to layer 21, greatly improving light-extraction efficiency.

Figure 4:
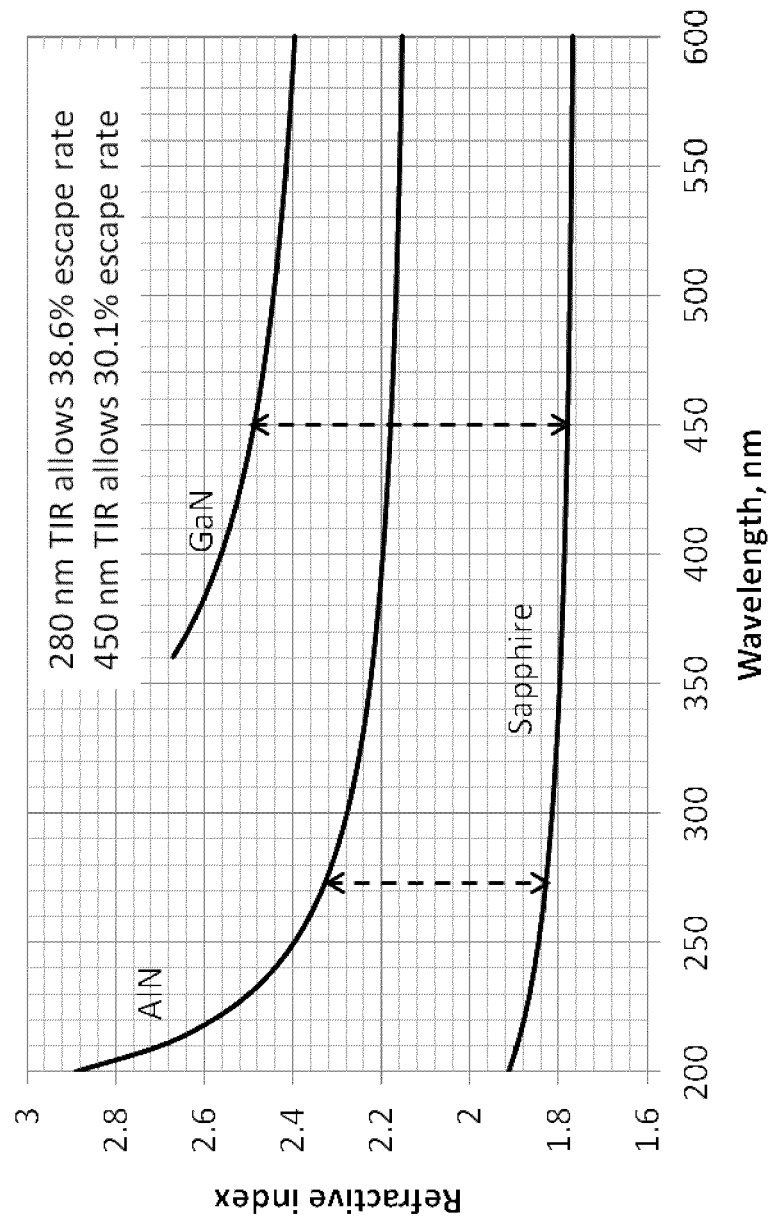
FIG. 4 plots the refractive indices as function with light wavelength (Sellmeier equation) for sapphire, GaN, and AlN crystals.

However, there exists another total internal reflection at the interface of layer 21 and substrate 10, for most visible and UV LEDs employ sapphire as substrate, and sapphire has a refractive index less than those of nitride semiconductors, as evidenced in FIG. 4. Combining the data shown in FIG. 4 and FIG. 1B, for a 280 nm LED using sapphire as substrate 10 and AlN as layer 21, TIR only allows ~38.6% 280 nm emission transmitting from layer 21 to substrate 10; for a 450 nm LED using sapphire as substrate 10 and GaN as layer 21, TIR only allows ~30.1% 450 nm emission transmitting from layer 21 to substrate 10. These data indicate a high need to get rid of this interface total internal reflection. In the prior art, patterned sapphire substrate is used to roughen the sapphire-nitride interface so as to alleviate total internal reflection (e.g. U.S. Pat. Nos. 8,384,111; 8,154,034).

Figure 5:
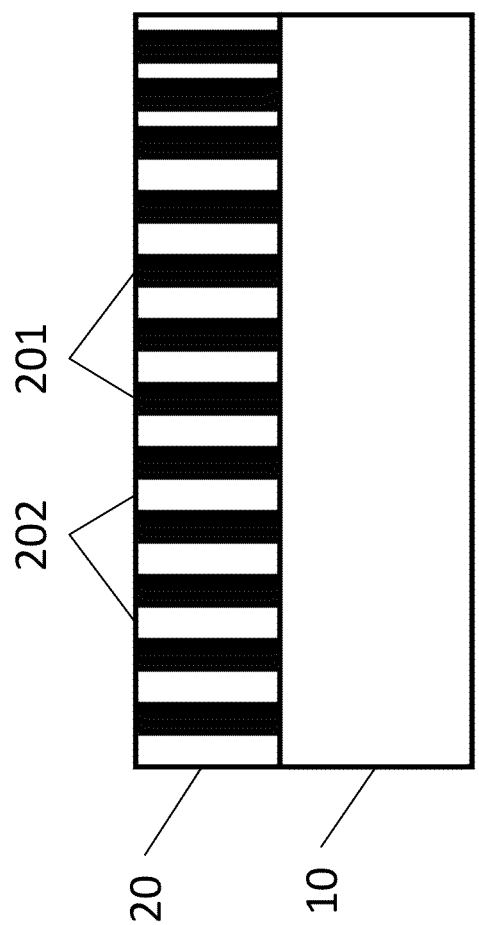
FIG. 5 illustrates the cross-sectional view of a nanoporous nitride layer formed over a substrate according to one aspect of the present invention.
Figure 8B:
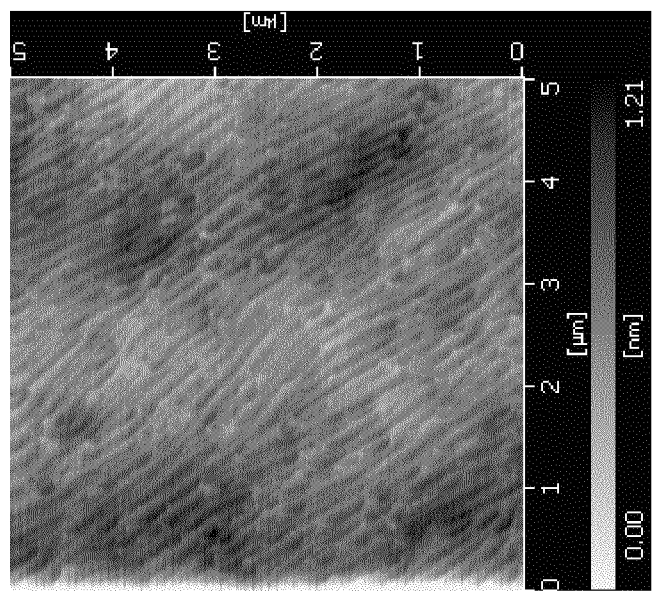
FIG. 8B shows the surface morphology of one regular AlN layer according to one embodiment of the present invention.
Figure 8A:
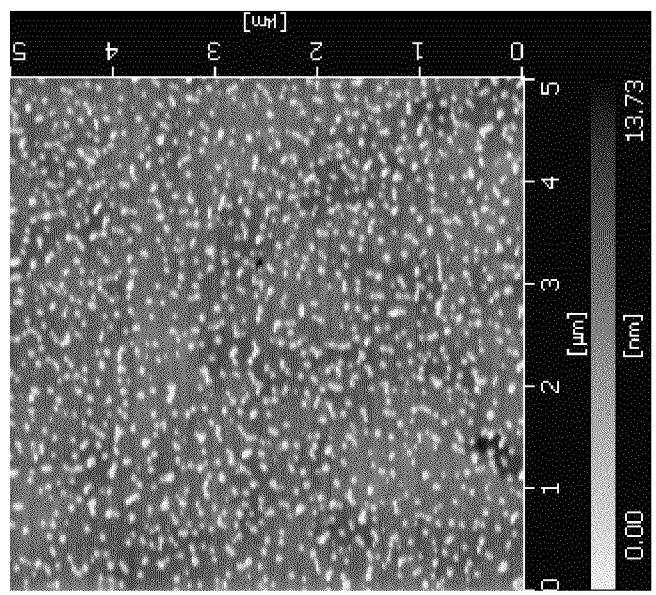
FIG. 8A shows the surface morphology of one nanoporous AlN layer according to one embodiment of the present invention.

Another aspect of the present invention provides a solution to reduce the total internal reflection between layer 21 and substrate 10. As illustrated in FIG. 5, embodiments of the present invention provide a nanoporous nitride layer 20 over substrate 10. Nanoporous layer 20 in general can be made of doped or undoped Al$_x$In$_y$Ga$_{1-x-y}$N with 0.1≥x≥0 and 0.1≥y≥0, or 1≥x≥0.5 and 0.1≥y≤0, for example, Al$_x$Ga$_{1-x}$N or In$_y$Ga$_{1-y}$N, with GaN and AlN being a specific example. Layer 20 can have a thickness of 100-2000 nm, for example 200-1000 nm. Layer 20 comprises randomly uniformly distributed nanopores 202 immersed in and separating nitride nano network 201. Nanopores 202 may have a vertical dimension (depth in the direction of growth of the nanoporous nitride layer) equal to, or smaller than the thickness of nanoporous nitride layer 20. For example, the nanopores may have a depth of 20-2000 nm. Nanopores 202 may have a lateral dimension of 20-100 nm and a density of 5×10$^8$ cm$^{-2}$-1×10$^{10}$ cm$^{-2}$, and are spaced by nano network 201 from each other within 20-500 nm. Nanopore's lateral dimension may be larger than 100 nm, provided subsequent growth can seal the nanopore's opening without pits formation in the device active-region. In another way of description, nanoporous layer 20 may have nanopores of density of 5×10$^8$ cm$^{-2}$-1×10$^{10}$ cm$^{-2}$ with porosity of 5%-50%. A typical surface morphology for nanoporous layer 20 is shown in FIG. 8A.

According to an embodiment of the present invention, nanoporous layer 20 is preferred to be a nanoporous AlN layer. The method to form a nanoporous AlN layer involves epitaxial growth of the nanoporous nitride layer at a temperature in the range of 1000° C.-1150° C. The epitaxial growth, such as metalorganic chemical vapor deposition (MOCVD), or molecular beam epitaxy (MBE), can be performed under hydrogen and ammonia ambient. Preferably, the epitaxial growth is periodically alternatively performed under ammonia-rich and ammonia-deficient ambient Ammonia-rich ambient is used for AlN epitaxial growth with limited Al-adatom surface diffusion length, whereas ammonia-deficient ambient facilitates Al-adatom surface diffusion and dissociation of defective AlN material to form nanopores within the epitaxial layer. The ammonia-rich condition refers to ammonia/metalorganic flow (V/III) molar ratio higher than 1000, whereas the ammonia-deficient condition refers to V/III molar ratio in the range of zero to 1000, inclusively. The overall epitaxial growth rate can be in the range of 300-1000 nm per hour. Depending on the epitaxial growth rate, the alternative ammonia-deficient and ammonia-rich ambient can last for 6 to 20 seconds and 10 to 24 seconds, respectively. A typical surface morphology for nanoporous layer 20 as-grown by this method is shown in FIG. 8A.

The nanoporous nitride layer can be formed on another nitride layer or a nitride template layer, or directly on a substrate selected from sapphire, silicon carbide (SiC), aluminum nitride (AlN) and silicon (Si). The method may further involve ex-situ nanopore modification process, which can be done via wet chemical etch of the in-situ formed nanoporous nitride layer to enlarge the nanopore size and modify its shape, in order to obtain the desired porosity. For example, after epitaxial formation of nanoporous layer 20, a wet chemical solution such as KOH solution can be used at elevated temperatures to etch the nanoporous layer to get enlarged nanopores and desired porosity. Phosphoric acid ($H_3PO_4$ or $H_3PO_4+H_2SiO_3$ mixture) can also be used to modify the nanopores size and shape.

On the other hand, the fabrication process for GaN or InGaN based nanoporous layer has been disclosed in U.S. patent application Ser. No. 13/358,438, which is herein incorporated by reference in its entirety. Briefly, the formation of GaN and InGaN nanoporous layers has to be performed under nitrogen and ammonia ambient at reduced temperatures (e.g. 650-950° C.).

The incorporation of a nanoporous layer between the device epitaxial structure and substrate disrupts the total internal reflection, resulting in improved light extraction efficiency.

Figure 6:
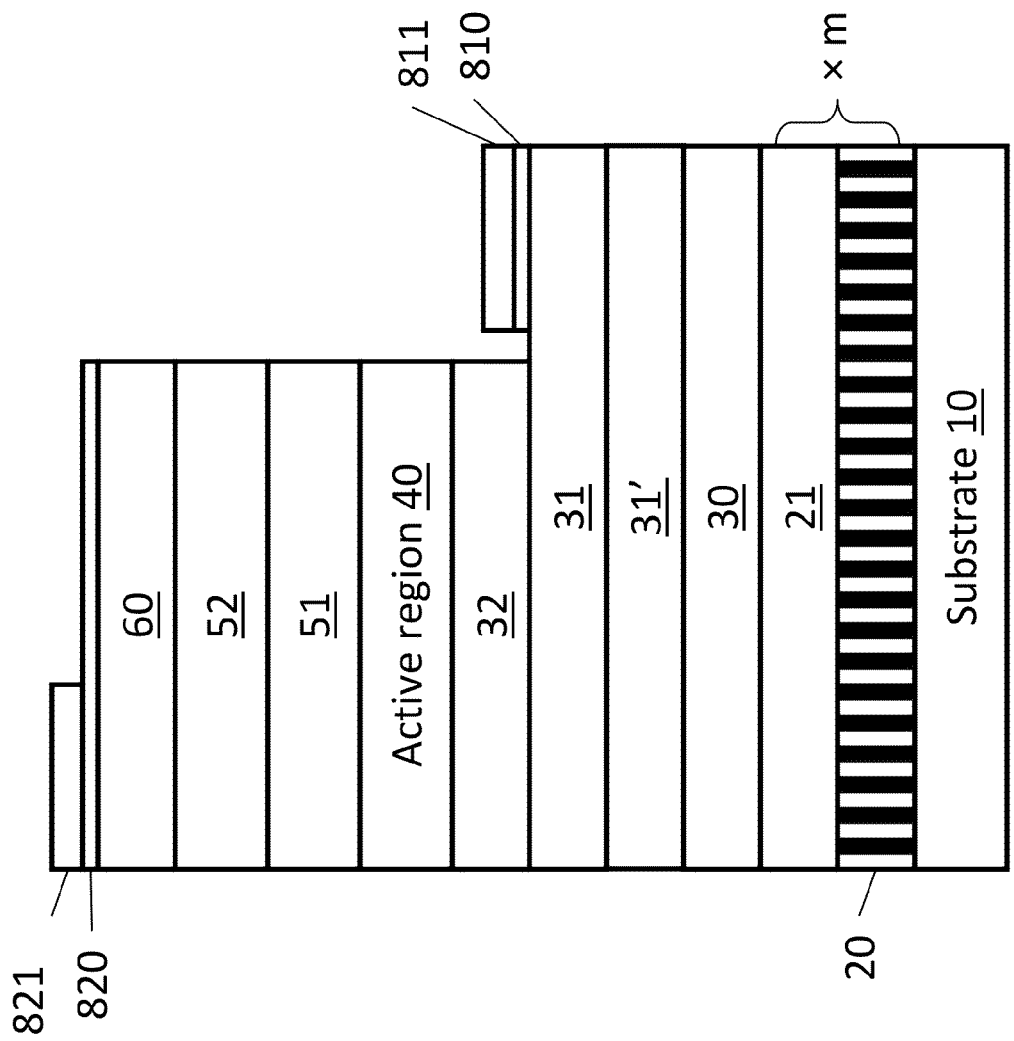
FIG. 6 illustrates the layered structure of an LED embodiment according to one aspect of the present invention.

The layered structure of an AlGaN-based UV LED according to this aspect of the present invention is illustrated in FIG. 6. Compared to the UV LED structure shown in FIG. 3, a nanoporous AlN layer 20 is inserted between substrate 10 and AlN layer 21. Layer 21 is of a sufficient thickness (e.g. 300-3000 nm) to fully cover nanoporous layer 20, without any nanopores left upon the accomplishment of layer 21. Typically, layer 21 is formed at higher growth temperature, growth rate and V/III ratio than that of layer 20, in order to seal the nanopore openings at the interface of layers 20/21. The formation temperature of layer 21 can be at least 100° C. higher than that of layer 20. In an embodiment, layer 20 is formed at 1100° with a growth rate of 600 nm per hour for 30 minutes, and layer 21 is formed at 1250° C. with a growth rate of 1500 nm per hour for 30 minutes. The normal formation V/III ratio for layer 21 is above 1000, for example 2000, or 2500. A typical surface morphology of a layer 21 overlying a layer 20 is shown in FIG. 8B.

Furthermore, as shown in FIG. 6, the layer pair 20/21 can be repeated m times, i.e. more than once, for example, 3 time, or 5 times. Repeating layer pair 20/21 several times can result in more light scattering into substrate 10 for enhanced light extraction efficiency, and can improve material quality enabling thicker layer 21 without crack formation. In an embodiment, substrate 10 is sapphire and layer 20 is a 250 nm-thick nanoporous AlN layer with randomly distributed nanopores of average size of 40 nm and sheet density of $5\times10^9$ $cm^{-2}$, and layer 21 is a 600 nm-thick AlN layer, and the layer pair 20/21 is repeated for 3 time.

Figure 7:
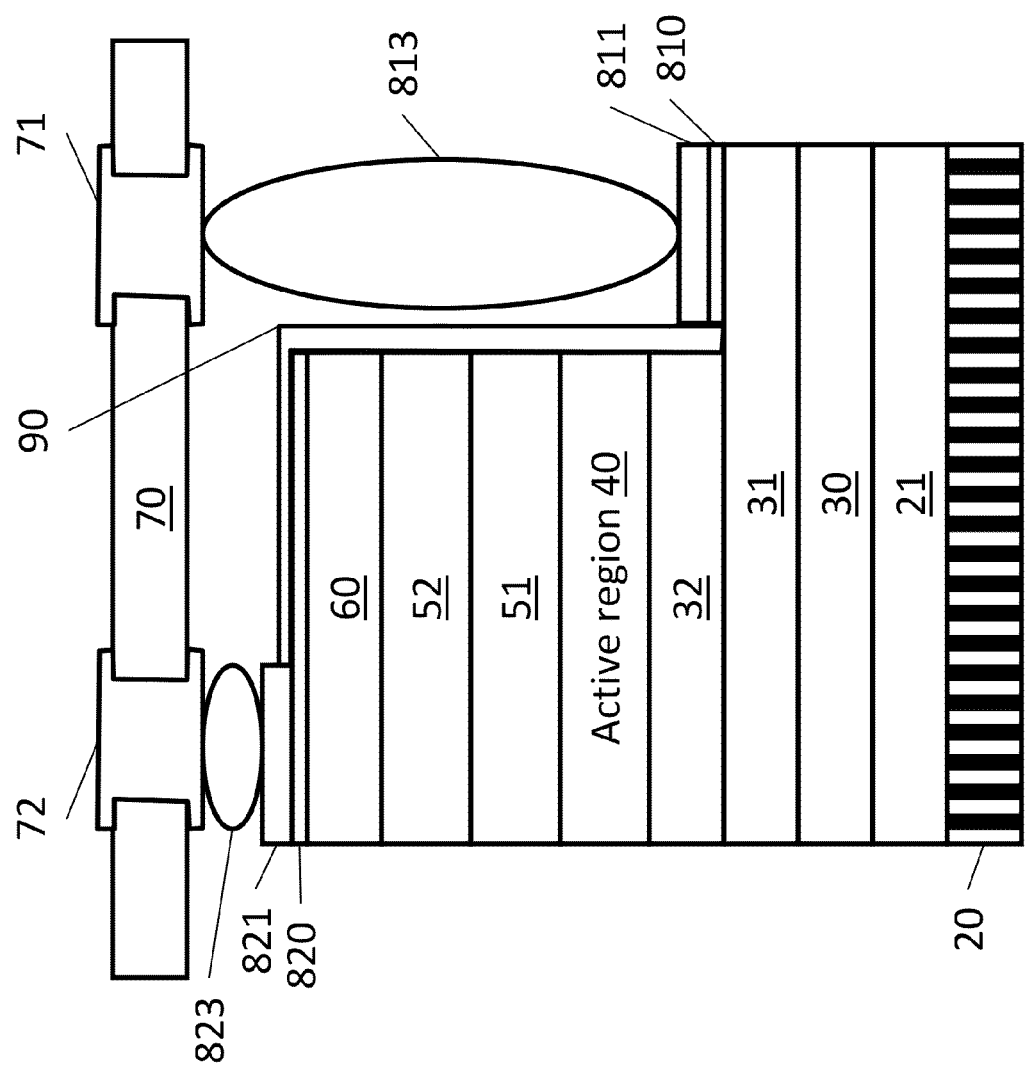
FIG. 7 illustrates the layered structure of a thin-film LED embodiment according to one aspect of the present invention.

The UV LED structure shown in FIG. 6 can also be fabricated into a thin-film flip-chip LED as shown in FIG. 7, where substrate 10 is removed and superstrate 70 with p-contact pad 72 and n-contact pad 71 is attached to the LED structure via attachment mechanism (Au ball or Au/Sn solder) 823 and 813, where attachment mechanism 823 is provide between p-contact pad 821 and p-contact pad 72, attachment mechanism 813 is provided between n-contact pad 811 and n-contact pad 71.

In other embodiments, the layered structures illustrated in FIG. 6 and FIG. 7 can also be for visible LEDs. In these embodiments, layer 20 is nanoporous AlN layer and layer 21 is AlN layer, whereas layer 30 is AlGaN layer with Al-content graded from that of layer 21 to that of layer 31', in the direction pointing from layer 21 to layer 31'. Furthermore, layers 31', 31 and 32 are respectively undoped GaN, heavily Si-doped GaN and slightly Si-doped GaN layers, and active-region 40 comprises GaN/InGaN multiple quantum wells for visible light emissions.

The embodiment shown in FIG. 7 has further improved light extraction efficiency as compared to the embodiment shown in FIG. 6, regardless of the active-region emission wavelengths.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is claimed is:

1. A light emitting device comprising:
   an n-type layer;
   a p-type layer;
   an active region sandwiched between the n-type layer and the p-type layer;
   a characteristic AlGaN layer over which the n-type layer is formed;
   an AlN layer on which the characteristic AlGaN layer is formed; and
   a nanoporous AlN layer over which the AlN layer is formed;
   wherein the characteristic AlGaN layer has gradually enlarging bandgap width from that of the n-type layer to that of the AlN layer in the direction pointing from the n-type layer to the AlN layer.

2. The light-emitting device according to claim 1, wherein the characteristic AlGaN layer is of a thickness larger than or equal to 80% of an active-region emission wavelength as measured in the n-type layer.

3. The light-emitting device according to claim 1, wherein the gradually enlarging bandgap width of the characteristic AlGaN layer is achieved via gradually increasing the characteristic AlGaN layer's Al-content from that of the n-type layer to that of the AlN layer.

4. The light-emitting device according to claim 1, wherein the active-region is GaN/InGaN multiple-quantum-well emitting near ultraviolet to visible light with wavelengths from 380 nm to 650 nm.

5. The light-emitting device according to claim 1, wherein the active-region is AlGaN/AlGaN multiple-quantum-well emitting ultraviolet light with wavelengths from 240 nm to 350 nm.

6. The light-emitting device according to claim 1, wherein the AlN layer and the nanoporous AlN layer are formed repeatedly for 2-5 times alternately.

7. The light-emitting device according to claim 1, wherein the nanoporous AlN layer comprises nanopores with lateral dimension of 20-100 nm, vertical dimension of 20-2000 nm and sheet density of $5\times10^8$ $cm^{-2}$-$1\times10^{10}$ $cm^{-2}$.

8. The light-emitting device according to claim 1, further comprising an undoped AlGaN layer and a Si-doped $n^+$ AlGaN layer, wherein:
   the undoped AlGaN layer is formed on the characteristic AlGaN layer;
   the Si-doped $n^+$ AlGaN layer is formed on the undoped AlGaN layer;
   the n-type layer is formed on the Si-doped $n^+$ AlGaN layer.

9. The light-emitting device according to claim 8, wherein the n-type layer is a slightly Si-doped n⁻ AlGaN layer and has the same bandgap width with that of the Si-doped n⁺ AlGaN layer and the undoped AlGaN layer, the bandgap width of the characteristic AlGaN layer at an interface with the undoped AlGaN layer is equal to the bandgap width of the undoped AlGaN layer, and the bandgap width of the characteristic AlGaN layer at an interface with the AlN layer is equal to the bandgap width of the AlN layer.

10. The light-emitting device according to claim 1, further comprising a substrate selected from the group consisting of sapphire, AlN, or GaN, Si, and SiC, wherein the nanoporous AlN layer is formed on the substrate.

11. A light emitting device comprising:
an n-type layer;
a p-type layer;
an active region sandwiched between the n-type layer and the p-type layer;
an AlN layer over which the n-type layer is formed; and
a nanoporous AlN layer over which the AlN layer is formed;
wherein the nanoporous AlN layer comprises nanopores with lateral dimension of 20-100 nm, vertical dimension of 20-2000 nm and sheet density of $5\times10^8$ cm$^{-2}$-$1\times10^{10}$ cm$^{-2}$.

12. The light-emitting device according to claim 11, wherein the AlN layer and the nanoporous AlN layer are formed repeatedly for 2-5 times alternately.

13. The light-emitting device according to claim 11, further comprising a characteristic AlGaN layer,
wherein the n-type layer is formed over the characteristic AlGaN layer, and the characteristic AlGaN layer is formed on the AlN layer,
wherein the characteristic AlGaN layer has gradually enlarging bandgap width from that of the n-type layer to that of the AlN layer in the direction pointing from the n-type layer to the AlN layer.

14. A light emitting device comprising:
an n-type layer;
a p-type layer;
an active region sandwiched between the n-type layer and the p-type layer;
an AlN layer over which the n-type layer is formed; and
a nanoporous AlN layer over which the AlN layer is formed;
wherein the AlN layer and the nanoporous AlN layer are formed repeatedly for 2-5 times alternately.

15. The light-emitting device according to claim 14, further comprising a characteristic AlGaN layer,
wherein the n-type layer is formed over the characteristic AlGaN layer, and the characteristic AlGaN layer is formed on the AlN layer,
wherein the characteristic AlGaN layer has gradually enlarging bandgap width from that of the n-type layer to that of the AlN layer in the direction pointing from the n-type layer to the AlN layer.

16. A light emitting device comprising:
an n-type layer;
a p-type layer;
an active region sandwiched between the n-type layer and the p-type layer;
a characteristic AlGaN layer over which the n-type layer is formed;
an AlN layer on which the characteristic AlGaN layer is formed;
an undoped AlGaN layer; and
a Si-doped n⁺ AlGaN layer;
wherein the undoped AlGaN layer is formed on the characteristic AlGaN layer, the Si-doped n⁺ AlGaN layer is formed on the undoped AlGaN layer, and the n-type layer is formed on the Si-doped n⁺ AlGaN layer;
wherein the characteristic AlGaN layer has gradually enlarging bandgap width from that of the n-type layer to that of the AlN layer in the direction pointing from the n-type layer to the AlN layer.

17. The light-emitting device according to claim 16, wherein the characteristic AlGaN layer is of a thickness larger than or equal to 80% of an active-region emission wavelength as measured in the n-type layer.

18. The light-emitting device according to claim 16, wherein the gradually enlarging bandgap width of the characteristic AlGaN layer is achieved via gradually increasing the characteristic AlGaN layer's Al-content from that of the n-type layer to that of the AlN layer.

19. The light-emitting device according to claim 16, wherein the active-region is GaN/InGaN multiple-quantum-well emitting near ultraviolet to visible light with wavelengths from 380 nm to 650 nm.

20. The light-emitting device according to claim 16, wherein the active-region is AlGaN/AlGaN multiple-quantum-well emitting ultraviolet light with wavelengths from 240 nm to 350 nm.

* * * * *